United States Patent [19]
Kanevsky et al.

[11] Patent Number: 6,092,038
[45] Date of Patent: Jul. 18, 2000

[54] SYSTEM AND METHOD FOR PROVIDING LOSSLESS COMPRESSION OF N-GRAM LANGUAGE MODELS IN A REAL-TIME DECODER

[75] Inventors: Dimitri Kanevsky, Ossining; Srinivasa Patibandla Rao, Jericho, both of N.Y.

[73] Assignee: International Business Machines Corporation, Armonk, N.Y.

[21] Appl. No.: 09/019,012

[22] Filed: Feb. 5, 1998

[51] Int. Cl.[7] ............................. G06F 17/27; G06F 17/28
[52] U.S. Cl. ................................. 704/9; 704/257
[58] Field of Search ............................ 704/9, 10, 1, 251, 704/255, 256, 257, 243, 270, 277; 707/530, 531, 532, 533, 534, 104

[56] References Cited

U.S. PATENT DOCUMENTS

| | | | |
|---|---|---|---|
| 4,342,085 | 7/1982 | Glickman, et al. | 707/532 |
| 5,467,425 | 11/1995 | Lau, et al. | 704/243 |
| 5,649,060 | 7/1997 | Ellozy et al. | 704/278 |
| 5,724,593 | 3/1998 | Hargrave, III, et al. | 704/7 |
| 5,794,249 | 8/1998 | Orsolono et al. | 704/104 |
| 5,835,888 | 11/1998 | Kanevshy et al. | 704/8 |

*Primary Examiner*—Joseph Thomas
*Attorney, Agent, or Firm*—F.Chau & Associates, LLP

[57] ABSTRACT

System and methods for compressing (losslessly) n-gram language models for use in real-time decoding, whereby the size of the model is significantly reduced without increasing the decoding time of the recognizer. Lossless compression is achieved using various techniques. In one aspect, n-gram records of an N-gram language model are split into (i) a set of common history records that include subsets of n-tuple words having a common history and (ii) sets of hypothesis records that are associated with the common history records. The common history records are separated into a first group of common history records each having only one hypothesis record associated therewith and a second group of common history records each having more than one hypothesis record associated therewith. The first group of common history records are stored together with their corresponding hypothesis record in an index portion of a memory block comprising the N-gram language model and the second group of common history records are stored in the index together with addresses pointing to a memory location having the corresponding hypothesis records. Other compression techniques include, for instance, mapping word records of the hypothesis records into word numbers and storing a difference value between subsequent word numbers; segmenting the addresses and storing indexes to the addresses in each segment to multiples of the addresses; storing word records and probability records as fractions of bytes such that each pair of word-probability records occupies a multiple of bytes and storing flags indicating the length; and storing the probability records as indexes to sorted count values that are used to compute the probability on the run.

32 Claims, 4 Drawing Sheets

SYSTEM AND METHOD FOR PROVIDING LOSSLESS COMPRESSION OF N-GRAM LANGUAGE MODELS IN A REAL-TIME DECODER

BACKGROUND OF THE INVENTION

The present invention relates to system and methods for compressing language models and, more particularly, to system and methods for providing lossless compression of n-gram language models used in a real-time decoding speech recognition system.

Conventional language models which are commonly used in automatic speech (or handwriting) real-time decoders are 3-gram statistical language models. In general, n-gram language modelling involves determining a set of potential choices, using probabilities, of a current word based on a number of immediately preceding words. Specifically, n-gram language modelling looks to a particular history, i.e., a sequence of (n−1) words, to select the most probable words from a given list of words based upon the one or more preceding words. In a preferred embodiment of the present invention, trigrams (i.e., n-grams with n=3) are the basis of the language models to be compressed. In the context of word language models, a trigram is a string of three consecutive words (denoted by w1 w2 w3). Similarly, a bigram is a string of two consecutive words, and a unigram is a single word.

A trigram language model is one which assigns a probability for predicting a future word (denoted by w3) given the past two words (denoted by w1 and w2). Such a model provides the probability of any given word to follow a word string of the form ". . . w1 w2 ", for all possible words w1 and w2 in a given vocabulary. This is demonstrated by the following equation: P(w3 w2 w1), which represents the probability that w3 occurs given that the previous two words were w1w2. A detailed explanation on n-gram language models may be found, for example, in F. Jelinek and R. L. Mercer, "Interpolated Estimation of Markov Source Parameters From Sparse Data," Pattern Recognition in Practice, E. S. Gelsema and L. N. Kanal, Eds., 1980, North-Holland, Amsterdam.

N-gram language models (such as trigrams) are trained using large text corpora. Such training involves inputting training data and tracking every sequence of three words (i.e., trigrams) in the training data. Such training provides counts for all 3-grams, 2-grams and unigrams identified in the training text. The count of a given n-gram is the number of occurrences of a given n-gram in the training data. As stated above, this language model data is then used to assign language model probabilities to strings of words that have a close match to a spoken utterance. This n-gram data is then stored in a decoder in such a way as to allow fast access to the stored probabilities for a list of alternative word strings produced by an acoustic decoding model.

In order to access the stored language model data, a conventional method typically used involves storing preceding tuples of words (i.e. word histories) together with addresses that point to memory locations containing sets of word-probability pairs (i.e., next candidate words with conditional probabilities), with both the address and the word-probability pair each occupying 4 bytes of memory storage. By way of example, assume that a table of pairs of words w1 1and w2 (i.e., bigrams) that were met in some training corpus are stored. For each such bigram w1 w2 in the table, an address A12 pointing to a set of word-probability pairs (w3, Prob12(w3)) is stored. The term w3 denotes a word that followed the bigram w1 w2 in the training text (assuming that the given bigram has a count exceeding some threshold amount, e.g., 3). The term Prob12(w3) denotes a conditional (log) probability of w3 following w1 w2 (which is estimated from the training corpus). As indicated above, each such address A12 and word-probability pair can be stored in blocks of 4-bytes. This 4-byte grouping scheme affords an efficient use of 32-bit memory processing chips which exist in some workstations and personal computers (PCs).

Experiments by the present inventors indicate that the storage of the 3-gram language model components (as represented above) requires approximately 5*n megabytes (MB) of memory, where n is a number of trigrams. For example, 8 trillion trigrams are generated for a speech recognition system which is trained to recognize a vocabulary size of 20,000 words. Having to store all the n-grams produced during training in accordance with the above method (as well as other known methods) requires a significant quantity of memory. Therefore, estimating and storing the probabilities for each of these trigrams is not practical.

Consequently, methods for filtering data are employed to reduce the number of n-grams which must be stored. One such method involves filtering out (i.e., pruning) those n-grams having low counts or those providing a small contribution to likelihood of the data. By way of example, assume that the size of a training corpus contains several hundred million words. With the pruning method, only bigrams with counts exceeding 10–20, for example, are stored. This would produce approximately 10–20 million of allowed bigrams. This pruning method, however, results in a substantial increase in the rate of error for the recognizer. Decoding experiments performed by the present inventors demonstrated a 10–15% improvement in the decoding accuracy using preserved (not filtered) language data as compared to using filtered language data. In practical applications, however, it is necessary to reduce the rate of storage of these language models to a certain number of 3-grams and 2-grams.

One approach to controlling the storage size of the language model without affecting the performance of the real-time recognition system is to compress the language model, i.e., storing the n-gram models in a compressed format. As demonstrated above, there are several distinct components of the language model such as an index area (W12) (e.g., bigram w1 w2 and address A12), words (e.g., W3) and probability records (e.g., Prob12(w3)). By reducing the storage requirements for each of these components, the language model may be significantly compressed.

Generally, there are conventional techniques for compressing index areas and records. For example, a typical method for address compression is the inverted file compression technique disclosed in "Managing Gigabytes," by Ian H. Witten, New York, 1994, p. 82, ch. 3.3. Further, conventional methods for compressing and storing records are the variable length coding, bitmap coding, prefix coding and Ziv-Lempel coding techniques which are disclosed in "Data Compression: Methods and Theory" by James A. Storer, Computer Science Press, 1988.

These general purpose compression methods, however, are not suitable for compressing n-gram language models in a real-time decoder because such methods do not facilitate a fast random access and decompression of the n-gram records, which is required for performing real-time decoding (e.g., processing and decoding a language model in real-time). In particular, the following requirements should be met when decoding in real-time. First, local data which is frequently accessed should fit into pages of memory or CACHE. Pages refer to blocks of contiguous locations (commonly ranging from 1K bytes to 8K bytes in length) in the main memory or secondary storage (such as a disk) of a digital computer, which constitute the basic unit of information that is transferred between the main memory and the secondary storage when required. For example, it is not feasible to separate word records and probability records and compress them separately since corresponding word numbers and probabilities should be located in close proximity so as to expedite processing for real-time decoding.

Further, compression methods that are based on histograms of word and probability distributions are difficult to implement for real-time decoding. The difficulty in using such histograms for words and probabilities lies in the fact that these histograms have different characteristics and may only be implemented if word records are separated from probability records. Consequently, as indicated above, it is not possible to separate word records and probability records when storing language models (since they should be located in close proximity).

In addition, the fetched data should be stored as a multiple of bytes since standard "seek" and "read" file commands operate with bytes and not fractions of bytes (see, for example, B. W. Kernigham and D. M. Ritchie, "The C Programming Language", Prentice-Hall, Inc., London, 1978). In addition, some operating systems (OS) work faster with 4-byte blocks of data.

Another requirement for decoding in real-time is that sets of language model records should be stored with each record having the same length. This allows a binary search to be performed for certain records of the language model.

These requirements cannot be met by utilizing the aforementioned conventional compression methods. For example, the inverse file compression technique is not applicable since the current n-gram language model uses a binary search on indexes. This requires that the index data be stored with equal lengths of data, which is not possible with standard inverse index methods. Further, the conventional variable length coding technique is not applicable since searching through records having variable lengths (e.g., W3) and fetching such records (e.g., Prob12 (w3)) is too slow for real-time decoding applications. The present invention addresses these problems and provides methods for significantly compressing n-gram language models without increasing the decoding time of such compressed models.

SUMMARY OF THE INVENTION

It is therefore an object of the present invention to provide system and methods for lossless compression of a language model in a real-time decoding speech recognition system.

It is another object of the present invention to provide system and methods for lossless compression of n-gram language models which provide significant reduction in the storage requirements for the n-gram models without increasing the decoding time for processing such models in real-time.

In one aspect of the present invention, a computer implemented method for compressing computer based language models in the form of a series of n-grams records, each n-gram record comprising a series of "n-tuple" words (w1, w2, . . . wn), a count and a probability associated therewith, the records being stored in a storage device operatively connected to the computer, comprises the steps of splitting the series of stored n-tuple words into subsets of n-tuple words having a common history; storing the subsets of n-tuples words having a common history together with a corresponding address such that the address points to subsequent n-gram records having a common history with the subsets of n-tuple words; and partitioning the subsets of n-tuple words having a common history into a first group and a second group, the first group corresponding to the n-tuple words having a common history which point to a single subsequent n-gram record, the second group corresponding to a remainder of the n-tuple words having a common history which point to subsequent blocks of n-gram records having more than one record, wherein the single subsequent n-gram record is stored in place of the address of the corresponding n-tuple words.

In another aspect of the present invention, a method for compressing n-gram language models includes the steps of mapping a series of words of n-gram records into word numbers; calculating a difference between subsequent word number of the n-gram records; and storing these differences such that the differences occupy smaller blocks of memory than the word numbers.

In yet another aspect of the present invention, the word numbers are sorted in descending order such that a most frequent word in a vocabulary of size N is assigned a word number being equal to 1 and a least frequent word in the vocabulary is assigned a word number equal to N. Since a linear search of the word numbers is performed to find the corresponding words, the average lookup time may be reduced by sorting the words in this manner (i.e., searching the most common words first).

In another aspect of the present invention, a method for compressing n-gram language models involves partitioning addresses into a plurality of segments such that each address in the segments occupies two bytes, and the actual address may be determined (i.e., reconstructed) from the partitioning data.

In yet another aspect of the present invention, a plurality of count values is stored, each of the count values being equal to log10 of said count for each of the series of n-tuple words of the n-gram records. An index to the stored count values is then stored in the probability portion of the n-gram record (as opposed to storing the actual probability value), such that the probability may be calculated on the run with the probability being equal to the difference between the log10 count values for the corresponding n-gram records. Moreover, a series of lambda weights for the probability values may also be determined on the run by using the stored count values.

In another aspect of the present invention, flags may be used to indicate the byte length of the n-gram records such that the records may be stored in lengths of 1 or 2 bytes (thereby providing compression) without affecting the ability to perform a binary search for data in areas with unequal lengths (thereby preventing any increase in the decoding time).

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention is directed to compressing (losslessly) n-gram language models for use in real-time decoding, whereby the size of the model is significantly reduced without increasing the decoding time of the recognizer. Although a preferred embodiment of the present invention relates to speech recognition, it is to be understood by one of ordinary skill in the art that the presently claimed invention may be used in many areas including, but not limited to, language translation, optical character recognition (OCR) and other related areas.

It is to be further understood that the system and methods described herein in accordance with the present invention may be implemented in various forms of hardware, software, firmware, or a combination thereof. Preferably, the present invention operates on a computer platform including hardware such as one or more central processing units (CPU), a random access memory (RAM), non-volatile hard-disk memory and an input/output (I/O) interface. The computer platform also includes an operating system and may include microinstruction code. A speech recognition system may be part of the microinstruction code or an application program to be executed via the operating system. Various peripheral devices may be connected to the computer platform such as a terminal, a data storage device and a printing device.

Figure 3A:
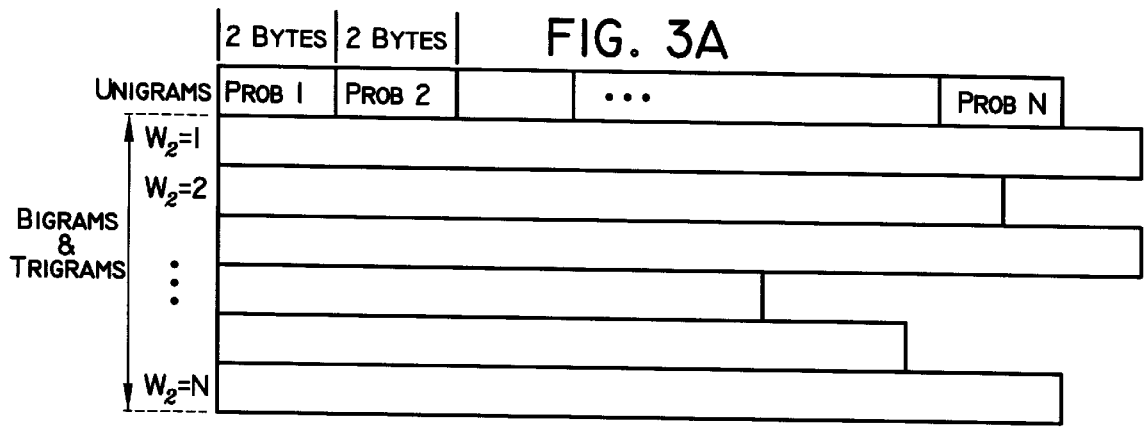
FIGS. 3a and 3b are diagrams illustrating a structure for a n-gram language model.
Figure 3B:
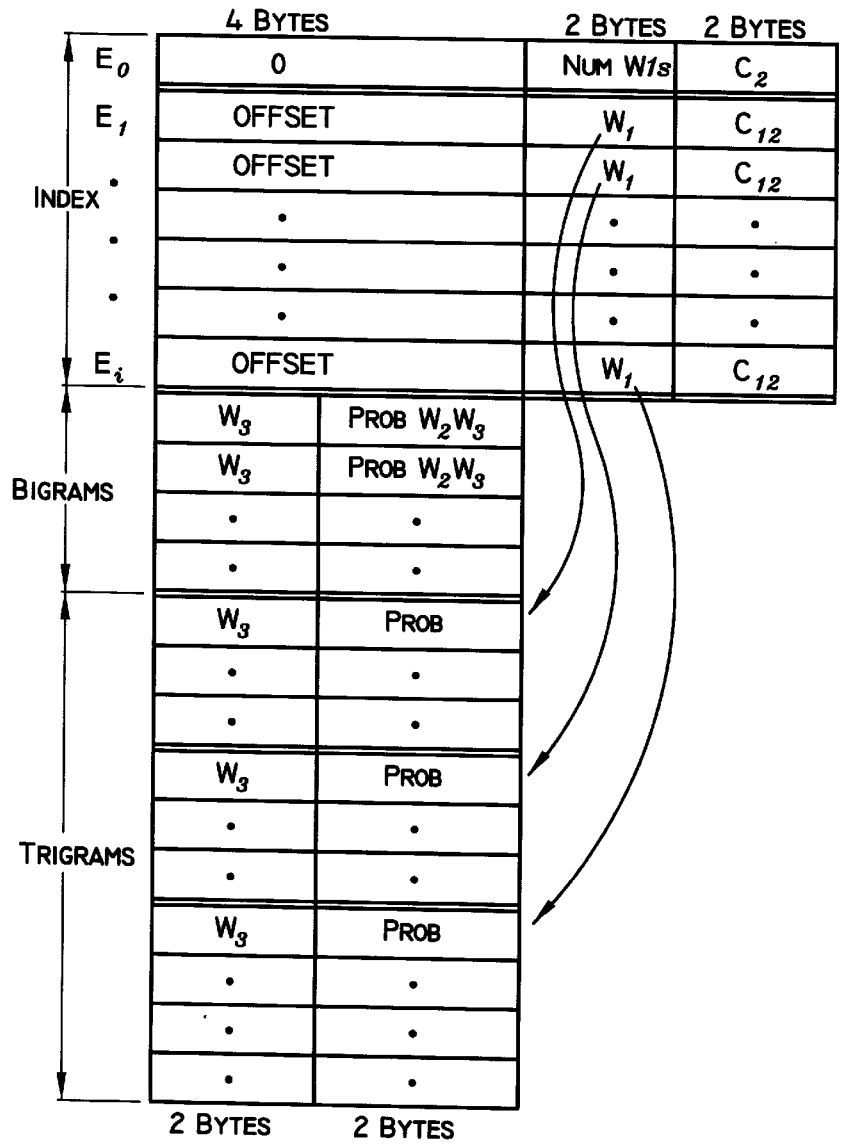

Referring now to FIGS. 3a and 3b, an uncompressed 3-gram language model as stored in a memory or data storage device is illustrated. First, each of the unigram probabilities for words 1 to N in a vocabulary are consecutively stored as 2 byte records. Next, bigram and trigram records are sorted and stored by the value of W2 from W2=1 to W2=N. Generally, as indicated above, a trigram record refers to a trigram (i.e. three words denoted by w1 w2 w3) and the probability of w3 following w1 w2. Generally, trigram records are stored only for frequently occurring words (w3). For example, this may be done to distinguish between the usage of the word "of" in two contexts such as ". . . a set" and ". . . the color," whereby the trigrams "a set of" and "the color of" are stored together with the probability of the word "of" in these two contexts.

Similarly, a bigram record is comprised of a bigram (w2 w3) and the probability of w3 following w2. Bigrams are used for somewhat less frequently occurring words. For instance, for the word "screen," only bigrams such as "movie screen" and "computer screen" may be stored together with their corresponding probabilities. For rare words, the word followed by the corresponding probability will suffice without need for any context information. These rare words are the unigrams shown in FIG. 3a.

In FIG. 3a, W2 is a symbolic notation for any word that precedes the word (denoted as W3) which is to be predicted. In the trigram example above, W2 may be "set" or "color" while in the bigram example, W2 may be "movie" or "computer". Typically, W2 (also W1, W3) is stored as an integer index of the word in the vocabulary rather than the word itself.

The size of such bigram and trigram records will vary depending on the number of bigrams and trigrams records pertaining to a particular W2 (as indicated by the varying length of rows for each W2 in FIG. 3a). For simplicity, FIG. 3a illustrates the records for each of the W2s as different rows. Realistically, such records are consecutively stored in memory. For fast access to the bigram and trigram records corresponding to a particular W2, the byte address of the beginning of each row in FIG. 3a is stored in a separate file which can be loaded into RAM and then read therefrom.

Referring to FIG. 3b, a detailed rendering in table form for each of the W2 rows (i.e., W2=1 to W2=N) in FIG. 3a is shown. The table is structured in 3 blocks, i.e., an Index block, a block of bigram records ("Bigrams block") and a block of trigram records ("Trigrams block"). The Index block is comprised of a collection of 8 byte entries which are further divided into 4 byte, 2 byte and 2 byte records. The first entry (denoted by E0) has an unused 4 byte space, followed by a two byte space containing the number of W1s (that preceded the current W2 in training) and a two byte space containing the count of W2 (denoted by C2).

The amount of remaining entries (E1–Ei) in the Index block (which are referred to as the "trigram-key entries") is equal to the number of W1s (i.e., (i) is equal to the number of W1s). Each of these trigram-key entries contains a 4 byte offset which points to a particular block of trigram records, a two byte space containing a W1 index, and two byte space containing a count of W1 W2 (denoted by C12). Specifically, the offset is the amount of shift for each trigram table in the Trigrams block (there is one trigram record table corresponding to each W1) from the ending position of the block of bigram records. By storing this number, a pointer may be quickly positioned to the beginning of a required trigram table.

Next, each row in the Bigrams and Trigrams block in FIG. 3b. constitutes a pair of values (word w3 and a probability). Specifically, the Bigrams block is comprised of a 2-byte space containing the index of W3s (which followed the current W2 in training) and a 2-byte space containing the probability of the bigram W2 W3 (denoted by ProbW2W3), i.e, the probability that the word W3 follows the word W2. As stated above, the entire record illustrated in FIG. 3b corresponds to one of the W2s (W2=1 . . . W2=N) shown in FIG. 3a.

The Trigrams block is similar to the Bigrams block except that is comprised of a plurality of trigram tables. As indicated by the arrows in FIG. 3b, there is one trigram table corresponding to each word W1 shown in the Index block. Each trigram table in the Trigrams block is comprised of rows having a 2-byte space which contains the index of W3s (which followed the current W2 and the particular W1 in the index area) and a 2-byte space which contains the probability of the word W3 to follow the pair W1 (which corresponds to that trigram table as shown by the arrows) and W2.

The offset stored in each of the entries (i.e, the trigram-key entries) in the Index block points to the corresponding trigram table. The separate file mentioned above (which stores the address for each W2 table) also stores the total length of the Index block and the Bigram block for each W2 table. The length of Index block for each W2 table may be computed from the number of stored W1s. This information, together with the trigram table offsets, enables the part of the Bigrams block or the part of the Trigrams block corresponding to any particular W1 to be directly accessed. Specifically, the length (in bytes) of the Index block for a particular W2 table (denoted by LI) is equal to 8 * (number of W1's+1). Next, the address of the beginning of the Bigrams block for that W2 table may calculated by adding LI to the address of the beginning of the particular W2 table (which, as stated above, is stored in the separate file). Further, the address of beginning of the Trigrams block for the particular W2 table may be calculated by adding LI (i.e, the length of the Index block), the length of the Bigrams block and the address of the beginning of the W2 table. The address of the trigram table corresponding to a given word W1 may then be found by adding the address of the Trigrams block to the offset value for that word W1.

In the language model described above in FIGS. 3a and 3b, the typical model includes 15.4 million trigrams records (which at 4 bytes each requires approximately 62 MB of storage), 10.6 million bigrams records (which at 4 bytes each requires approximately 42 MB of storage), and 2.6 million trigram-keys (which at 8 bytes each requires approximately 20 MB of storage). The entire file thus requires 124 MB of memory. The 3-gram model described above may be modified in accordance with the teachings of the present invention (as will be described in detail below with reference to FIGS. 1, 2 and 4) to reduce the redundancy in the representation of the n-gram language model data so as to achieve significant data compression, while retaining fast access to the n-gram records. For instance, of the total 124 MB memory, 1.3 million trigram-key entries correspond to a single W3, thus, obviating the necessity for storing the offset of trigram part and probability (i.e., the probability of W3=1). Further, the trigram lists are long enough in only a few cases to require 4 byte offsets (for e.g. less than 75 in 21,000 W2s). Therefore, such redundancy in the data representation may be removed to reduce the memory requirements for storing the n-gram models.

The underlying principles of the present invention are based on splitting the n-gram language model into several parts and selecting substructures to which special compression methods may be applied for compressing the language model data. Some of these parts or substructures can be classified as follows:

a. Common History

In general, common history is used to compress n-gram language model data whereby the n-gram records having a common history are not repeated. A set of all stored N-tuple words w1, w2, ... wN may be split into subsets of n-tuples having the same word history (i.e., a common history). For example, assume a set of 3-tuple words is denoted as W123. Parts or subsets of the 3-tuple words having the same history are denoted by H(w)={w1,w2,w3|w=w1, where (w1,w2,w3) belongs to W123}, whereby each subset H(w) consists of all the parts (i.e., w1, w2 and w3) from W123 having the same history w1.

For example, assume there are three records of 3-tuple of words (W1 W2 W3): (10, 20, 3); (10, 20, 10); and (10, 20, 20) having a common history W1=10, W2=20. These records could be written without repeating the common elements for instance as follows: (10,20 ) (3,10,20). But in order to write these records in this manner, certain rules and marks should be used to indicate which parts of such records correspond to history information and which parts correspond to consequent words having this common history. These rules and marks should be implemented in such a way that the additional memory needed to store such marks is less than the memory needed to store those records having a common history which are not repeated and that the speed for accessing such data is not reduced during real-time decoding.

Referring to FIG. 3a, W2s are common history records with values from 1 to N (where N is a size of a vocabulary). Every W2 =i points to block of records with a different W1 and W3 (but the same W2=i). These blocks of records (W1 and W3 for a given W2=i) are large and, therefore, storage is saved by not repeating W2 for each pair W1, W3 having the same W2=i. Further, as indicated above, a small amount of storage must be allocated for an address to indicate where the blocks of records for a given W2=i are stored (this address generally does not require more than 4 bytes for each W2=1, ... N).

As indicated above, FIG. 3b represents a structure (i.e., W2 table) of blocks records for a given W2=i. In FIG. 3a, each W1 (i.e, W1=j) are common history records (which are written in the Index block between the offset and counts C12). Each W1=j points to a set of records having a different W3, but the same W1=j and W2=i. Specifically, for a given W2=i and W1=j, the records that are stored are (i,j, W3) for trigrams (in the Trigrams block) and (i,W3) for bigrams (in the Bigrams block). In addition, a small amount of storage is required for each W1=j in the index block to indicate an address of a block of records W3 (i.e., the offset). As explained in detail below with reference to FIG. 4, the presently claimed invention provides a method for storing common history records to further reduce the memory space while maintaining fast access to data.

b. History Partition

Common history partitions provide a way to specify different rules and marks for how consequent records are stored. Such partitions allow different compression techniques to be used for different parts on common histories and the different blocks of subsequent records (to which these common histories point). Specifically, word histories point to large and small sets of subsequent sequences of word records. Consequently, such word histories may be partitioned in accordance with the sizes of such sets.

For example, assume H(w1,w2)={w3|(w1,w2,w3) belongs to W123} represents a set of all w3 with the same history, w1, w2. Experiments indicate that, in a typical collection of language model data, there are very large numbers of pairs w1, w2 such that H(w1, w2) consists only of one element (i.e., there is only one 3-tuple w1, w2,w3 with the history w1, w2). Furthermore, there are several pairs w1, w2 such that the size of H(w1, w2) is close to the size of a vocabulary (i.e. a set of all words that are used in constructing the language models). Consequently, 2-tuple histories may be split into three parts, with the first part H(w1, w2) consisting of one or several elements, the second part H(w1, w2) consisting of virtually all the words in the vocabulary, and the third part consisting of the remaining histories. This aspect of the present invention will be explained in further detail below with reference to FIG. 4.

c. Cumulative Addresses Of Sequential Blocks Of Data.

Word histories point to addresses (e.g., A12 as described above) where blocks of subsequent records are stored. For purposes of the present invention, histories with addresses are referred to as the "index area" (i.e., the Index block).

If these blocks of subsequent records are placed sequentially, numerical values of addresses to these blocks grow monotonically and slow for most of the blocks. This allows an efficient compression technique to be employed to reduce the storage for addresses. For example, a set of addresses can be split into several parts depending on how many bytes are needed to write these addresses. Further, certain compression techniques may be applied which take advantage of cumulative growing of addresses (to be further explained below in detail). In order to exploit a cumulative address growing, one can perform the following procedure. Let $A\_1, A\_2, A\_3, \ldots A\_N$ be integers representing addresses which grow monotonically (i.e. $A\_i < A\_j$ if $i<j$).

Assume that the largest address A_N fits 4 bytes. The addresses can be partitioned into segments as follows: A first segment contains all addresses A_1, A_2, ... A_k that are less than 65536 (i.e. each address occupies 2 bytes). The second segment contains the remaining addresses A_k+1, ... A_2k that are less than 2*65536. The third segment contains all remaining addresses that are less than 3*65536 and so on.

We can then store addresses in the i-th segment as numbers B_r = A_r —(i−1) * 65536 where A_r represent the addresses from the i-th segment. From the definition of segments, B_r is not negative and can fit two bytes. Consequently, instead of storing all addresses $A_{-1}$ ..., A_N, the numbers B_1, ..., B_N are stored, whereby a small table of multiples may be stored which provides information on what value (i.e., i * 65,536 (i=0,1,2, 3 ... )) should be added to the indexes in each segment to obtain the actual value for the address in each segment (i=the ith segment).

If there are a large number of addresses A_i which require 4 bytes to be stored, the saving can be significant since every B_i occupies only 2 bytes. Further, the table of multiples described above occupies a very small space. Therefore, the savings are approximately of the order of M*2 bytes where M is the number of A_i that require 4 bytes. As demonstrated below in FIG. 4, this method is implemented for the offset which occupies only 2 bytes (as opposed to the 4 bytes needed for the offsets in FIG. 3b).

If a set of histories is large, it is necessary to use a binary search on such set of histories to determine which address (e.g., A12) to fetch. Consequently, when a binary search is performed, addresses should be stored with an equal number of bytes along a set of histories.

A standard binary search is explained by way of example. Assume that we have seven (7) 3-dimensional vectors that are stored as follows:

(1, 5, 3);
(4, 8, 1);
(6, 2, 3);
(7, 5, 5);
(8, 1, 1);
(9, 1, 0); and
(10, 3, 8).

In this table, all first components of the vectors are ordered from the smallest value 1 to the largest value 10. Assume that the content of a vector whose first component is 7 is to be fetched. One way this may be performed is by performing a linear search (i.e., reading the content of the first component of each vector starting the first vector (1,5,3) and moving down until the line (7,5,5) is reached). In this example, 4 operations are required to fetch the desired data.

A faster method would be to perform a binary search. This involves first pointing to the 3rd line (an integer part of 7/2) and determining if the first component on the 3rd line (6) is less than or greater than 7. In this example, the first component 6 is less than 7. Therefore, the pointer would move to the line between the 3rd and 7th lines (i.e, line 5 (8, 1, 1)) and determine if the first component is less than or greater than 7. In this example, 8 is greater than 7. Therefore, the pointer would move to the line between the 3rd and 5th lines (i.e., line 4 (7, 5, 5)) which is the data that is to be fetched.

As demonstrated in the above example, the binary search requires 3 operations as opposed to the 4 operations required by the linear search. The reduction in the search time using a binary search increased significantly with large amounts of data. In the above example, a binary search may be performed since all vectors have the same length—3 components. If these vectors had different lengths, the middle lines for each operation could not be immediately located. This example illustrates that the standard binary search requires that all data records through which a search is done have the same length.

In FIG. 3b, a binary search is performed on the Index block. In the Index block, the data offsets are ordered from the smallest at the top to the largest at the bottom. The Index block (like the above example) can be considered as a set of 3-dimensional vectors with the components offset, W1 and C12. Each line of the Index block (i.e., the offset, W1 and C12) has the same length (8 bytes). Therefore, a binary search may be performed in the Index block. As explained in detail below with reference to FIG. 4, the index area may be split into two parts, each of which having records of the same length so as to retain the benefit of using the binary search for each of the parts.

d. Blocks Of Subsequent Records (Words And Probability Scores) With A Common History.

Word histories (e.g., w1, w2) point to blocks of subsequent records (e.g., H(w1, w2) that contain future word sequences (e.g., w3) and probabilities of those word sequences (e.g., Prob(w3|w1,w2). Such "blocks of subsequent records" may be denoted as "hypothesis". The word and probability parts of such records give rise to "word and probability hypothesis". Both word hypothesis and probability hypothesis have distinct statistical distributions and, therefore, different strategies may be employed for their compression. These word and probability records are linked, as demonstrated by the exemplary probability expression Prob(w3|w1, w2). Therefore, word and probability hypothesis compression strategies cannot be independent but should be linked. It is convenient to either store a word record (e.g., w3) near a probability record (e.g., Prob(w3|w1, w2)) or have a simple method whereby a given word hypothesis may compute the location of a related probability hypothesis.

e. Flags For Variable Length Records.

Hypothesis (word, probability) record data (e.g., H(w1, w2)) may be split into two subsets with the first set (set A) comprising n-th records and the second set (set B) (after the n-th record) comprising the remaining records. As described in detail below, different methods for storing these subsets are as follows: For set A, flags may be stored that mark the length of each word-probability record in the index block; and for Set B, flags may be stored that mark the length of the word/probability area in word/probability records in such a way that the size of the flags+word+probability records fill a multiple of bytes.

In general, flags indicate the length of certain records which are to read. For example, consider the following records (2, 257). The first record requires only one byte of storage and the second requires at least two bytes of storage. The length of the record could be indicated by using a flag, i.e., the first bit in a record to indicate whether the record requires 1 byte or two bytes of storage. Specifically, the first bit=0 may be used to indicate that the record fits the remaining 7 bits (i.e., the record with a flag would take 1 byte). Further, a first bit=1 may be used to indicate that the record fits remaining 15 bits (i.e, the record with a flag would take 2 bytes).

As indicated above, flags may be used to reduce the storage of data records since each record does not have to be written with the same length (i.e, the flag indicates the length of the data record). But flags result in an increase in the access time since the flags must first be read to determine the length of the record before the content of the record is read. As explained in detail below, the present invention provides a method for utilizing flags to reduce the storage requirements of the data records, while mitigating or eliminating the increased access time resulting from the processing of flag data.

In applying different algorithms to parts and structures of the language model as described in a-d above, certain issues must be considered. To begin with, the computation speed in a computer depends on areas where data is stored or loaded. For example, computations performed on data loaded into a CACHE and RAM computer memory are significantly faster then those computations performed on data contained in hard-disk memory. The advantage of faster computations in CACHE and RAM computer memory, however, is offset by the fact that a relatively smaller amount of data can be loaded into and processed in CACHE or RAM as opposed to hard disk memory. The more data, however, that can be loaded into RAM via data compression, for example, the faster the data computation.

Methods for compressing data, however, may require more steps to process compressed records. But, since more data can be loaded into RAM in compressed form, the overall time to process the compressed data (via the compression algorithm) may be less than computation time with uncompressed data that is stored on a hard disk. The ratio of number of algorithmic steps to process the compressed data to the amount of compressed data that can be loaded into RAM, as well as the overall processing performance, depends on the specific computer being used.

In addition, an increase of the number of n-grams in the language model results in an improvement in the accuracy of the decoding. The parts of speech data that are recognized by a decoder with higher accuracy are usually processed faster as compared to parts of speech data with lower decoding accuracy by some components of a decoder for the following reason. In a language model having higher accuracy, a decoder usually processes a smaller number of alternative decoding paths (e.g., fast match words). This decrease in the number of candidates words leads to a decrease of the decoding processing time. This decrease in the decoding time can offset the increase of time of processing a language model that results from the increase of number of language model n-grams. By experimentally varying the level of compression in a language model, an optimal increase of number of n-grams may be found which does not result in an increase in the general decoding time.

Below, several conceptual algorithmic approaches to compression are described in accordance with the present invention. These algorithms provide different levels of compression and have different levels of complexity. The decision of which algorithm to employ should depend on the type of computers to be used in performing the given compression method. The various compression methods in accordance with the present invention are as follows:

I) Writing Hypothesis In An Index Area.

If certain histories point to a small number of records (e.g., (1) for H(w1, w2) in b above)), these records should be directly written, as opposed to writing an address which points to a block of subsequent records. Particularly, as demonstrated above, an address usually occupies 4 bytes. Therefore, if there is only one record (i.e, word/probability record (W3, prob)), such record may be written instead of the address. Histories in an index area are usually processed via a binary search and, therefore, each part of the Index block should be stored with an equal length.

II) Use Fractions Of Bytes.

Word or probability (hypothesis) records should be written in fractions of bytes. For every related word and probability record, however, the sum of bits to store such records should fill multiples of bytes. For example, 0.5 bytes may be used for a word W3 and 0.5 byte or 1.5 bytes may be used for a probability record Prob(w3|w1w2)(given history w1w2). By storing a hypotheses record (W3, Prob (w3|w1w2)) as a multiple byte block, the "read" and "seek" facilities in a programming language that scans data via a whole number of bytes may be efficiently used (see, e.g., C, see B. W. Kernighan, D. M. Ritchie, "The C Programming Language", Prentice-Hall, INC., London, 1978)). Indeed, when a hypothesis record is fetched, its content can be easily read notwithstanding that its content may be contained in fractions of bytes blocks.

III) Sorting Word Hypothesis And Delta-Compression Technique.

A vocabulary N may be sorted by descending frequencies. Words in a vocabulary N are mapped into integers that are called word numbers, whereby each number from 1 to N (vocabulary size) represents a unique word in the vocabulary. Each word in the vocabulary has known frequency (i.e. how often the word was met over the textual corpora used to make the language model). The vocabulary is then sorted by descending frequencies with the number 1 corresponding to the most frequent word, number 2 corresponding to the next most frequent word and so on.

Word numbers that are stored in a data language model are typically arranged in several blocks. This is demonstrated in FIG. 3a, wherein word numbers for W2 (W2=1 ... W2=N) are shown. In addition, word numbers W3 are represented in the Index block (for each fixed W2=i). The word numbers W1 are represented in the Bigrams and Trigrams blocks. There is one Bigrams block in FIG. 3b for each W2 in FIG. 3a and one Trigrams block for each W1 in the Index block in FIG. 3b. Word numbers in each of these blocks are sorted (i.e. stored) in an increasing order from the lowest value to the highest. For example, in FIG. 3a, all word number records correspond to values of W2 from 1 to N (from the top to the bottom). Further, the W1s in the Index block are sorted in increasing order (from the top to the bottom) and likewise for the W3s in the Trigrams and Bigrams blocks.

In FIG. 3b, significant compression may be achieved if the first W3 for each block is fully written and then the value of the differences between subsequent word numbers W3 are written. For example, if in a Bigrams block W3 consists of the word numbers 2, 5, 10, 12 ..., such information could be written as 2, 3, 5 2 ..., where 2 is the first W3 fully written, 3 is the difference between 5 and 2, 5 is the difference between 10 and 5 and 2 is the difference between 12 and 10. Thereafter, word number values can be restored from these differences. Since the word numbers are written as a difference of subsequent words, they require a smaller amount of bits to be represented. Therefore, if we use flags to represent both word record lengths and word differences, than to store wholespace to store word differences than to store whole word numbers, whereby differences of consequent word numbers (W3) may be written if they fit 1 byte, or full size (or difference) if they fit two bytes. (Examples of delta compression technique are described in Ian H. Witten, Managing Gigabytes, New York, 1994).

IV) Index To Probability Hypothesis Records.

Hypothesis probabilities may be represented as a ratio of counts of events, whereby an index to sorted counts may be stored. Probabilities may then be computed on the run (i.e., values are computed while a decoder is running as opposed to fetching a value from storage) as function of the index of relevant counts. For example, let P=log10 Prob(w3|w1w2)= log10 (count3/count12), where the term count3=the number of w1w2w3 in the language model training corpus and the term count12=the number of w1w2 in the same corpus. Rather than storing the value of P, the two values log10 (count3) and log10(count12) are stored. Next, each log10 (count12) per every block of hypothesis records (H(w1, w2)) is stored. Next, blocks of hypothesis probability records are stored as an index to the sorted log10(count3) data (i.e., sorted in descending order). Next, the index is written as 1 byte or 2 bytes, depending on its value.

The value of P can be computed on the run as the difference of log(count3) and log10(count12). Since the operation of substraction is very fast (as opposed to division count3/count12) it takes minimal time for a decoder to compute a value for P. Further, storing an index to the values log10(count3) and log10(count12) in accordance with the present invention takes much less space then storing the difference P since there are significantly less number of different indexes to log10(count3) and log10(count12) than there are different indexes to differences log10(count3)–log10(count12)

By way of example, there are the following several values for log10(count3) : 11, 12, 24 and for log10(count12): 11, 12. Only three indexes 0,1,2 are needed to store these 5 numbers. (e.g.,g 0 points to 11, 12 points to 12 and 2 and 2 points to 24). But there are 4 different values for log10 (count3)-log10(count12) (e.g., 11–11=0, 11–12=–1, 12—11=1 and 24–12=12). Consequently, 4 indexes (0,1,2,3) are needed to store these values. When the amount of values for log10(count3) and log10(count12) is significant, this difference in the number of indexes can be significant. Thus, it makes sense to split a value P into two values log10 (count3) and log10(count12).

V) Different Interpretations For The Same Stored Values.

Some records in a language model may be used to define weights (e.g., lambda) of scores (i.e., language model probability values). As indicated above, a language model probability for a sequence of words is computed from subsequences of 3 words W1, W2, W3 which produce a whole word sequence. The score(W1 W2 W3) (i.e., the approximate probability of log10 (Prob(W3|W1,W2)) is represented as a weighted sum of language model values (scores): lambda1*log10(Prob(W1)+lambda2 * log10(Prob (W3|W2)+lambda3 * log10(ProbW3|W1W2), whereby lambdas 1, 2 and 3 are weights.

These lambda have different values which depending on the values of C12 and C2 in FIG. 3b (the higher these values the higher are corresponding lambda).

In FIG. 3b, the values for C2 and C12 are used only to find the value of such lambda (from a precomputed table that is not shown).

Figure 4:
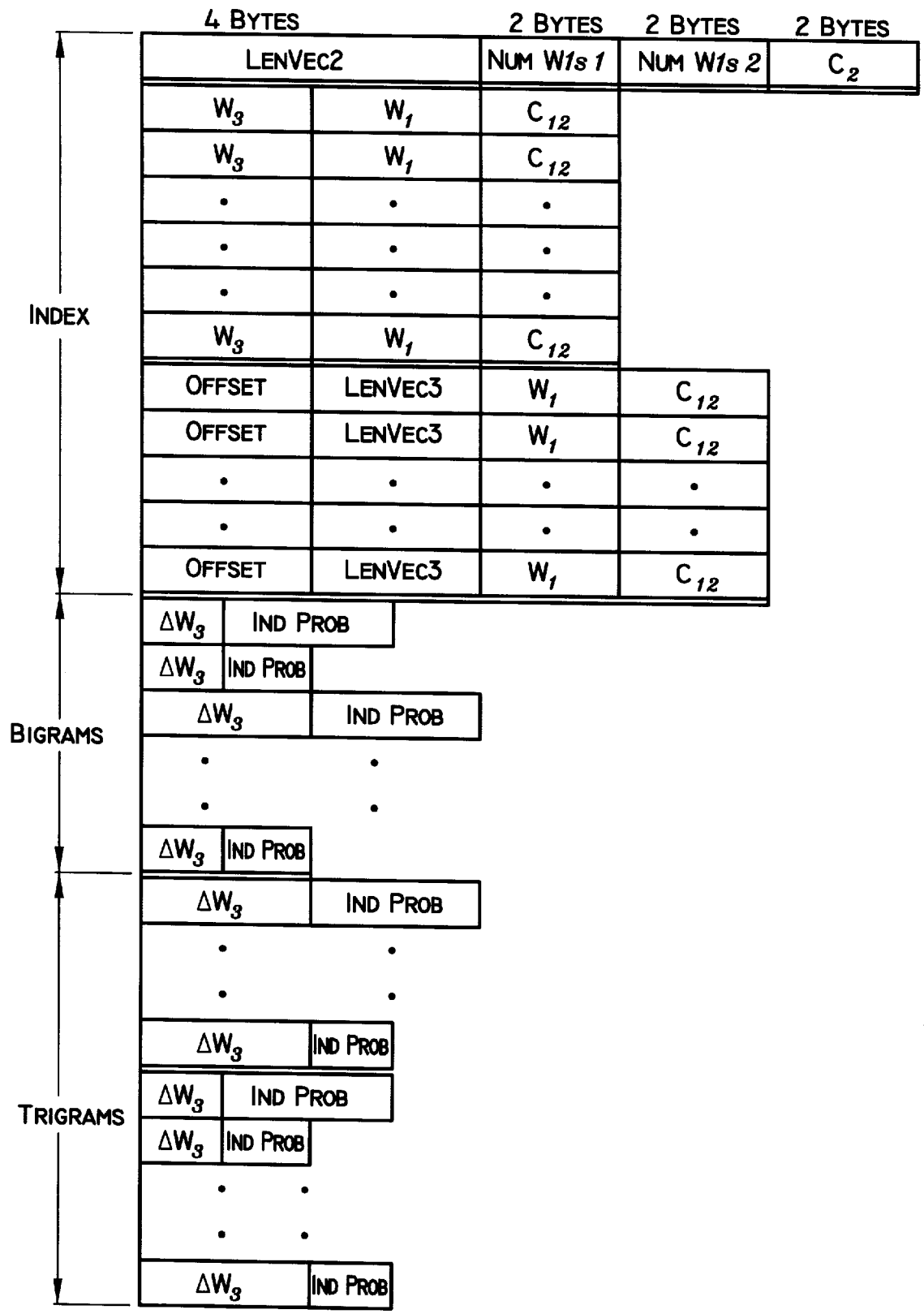
FIG. 4 is a diagram illustrating a structure of a modified (compressed) n-gram language model in accordance with the present invention.

The values for C2 and C12 are used for two purposes in accordance with the present invention. The first purpose, as shown in FIG. 3a, is to extract lambda values. The second purpose for the values of C2 and C12 is to compute probabilities on the run as described above (C12 corresponds to log10(count12)). In FIG. 3a, probabilities are stored as log10 Prob(W3|W1W2). In contrast, the values of the probabilities in FIG. 4 are computed as differences on the run. Thus, the concept of attaching several different functions to the same values (computing lambda and computing probabilities on the run) provides for additional storage since one value for several functions is stored as opposed to each value for each function.

Figure 1:
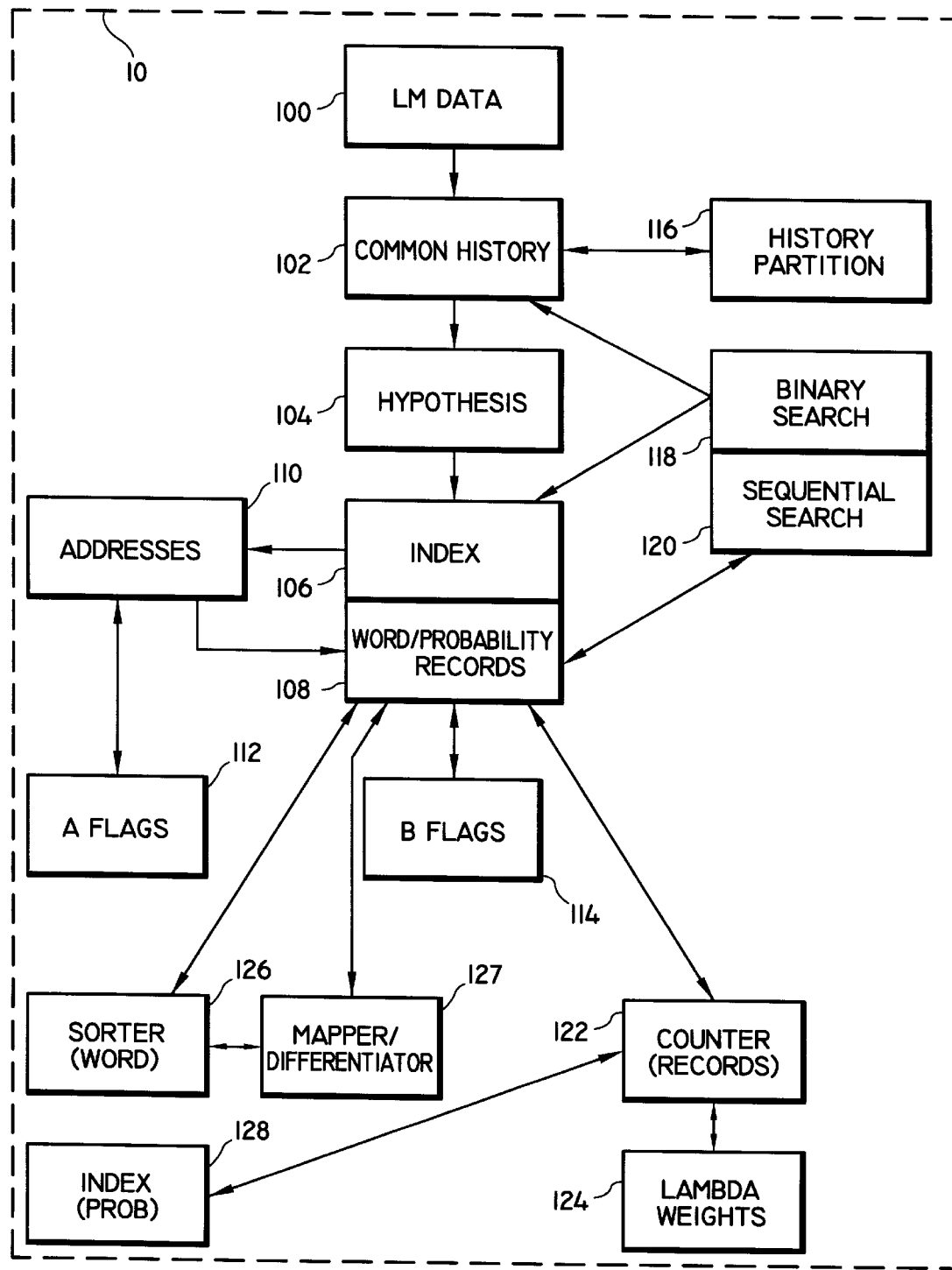
FIG. 1 is a block/flow diagram of system and methods for compressing n-gram language models in accordance with the present invention.

Referring now to FIG. 1, a block/flow diagram of a system and methods for compressing language models in accordance with the present invention is shown. As indicated above, it is to be understood that the functional modules of the present invention are preferably implemented in software and may include any suitable and preferred processor architecture for practicing the invention by programming one or more general purpose processors. It is to be further understood that, because some of the components of the invention described herein are preferably implemented as software modules, the actual connections shown in the figures may differ depending upon the manner in which the invention is programmed. Of course, special purpose processors may be employed to implement the invention. Given the teachings of the invention herein, one of ordinary skill in the related art will be able to contemplate these and similar implementations of the elements of the invention.

In a system 10 of FIG. 1. whole language model (LM) data 100 are used to generate history records via the common history module (102) and hypothesis records via the hypothesis module (104) which are stored in an index module (106) and a word/probability record module (108). The index module (106) also includes addresses generated by address module (110) which point to word/probability records that are stored in the word/probability record module (108) and a set of A flags which are generated by an A Flag module (112). The A Flags indicate the length of a first k of word/probability records in the word-probability module (108) (with k=16 or 8 as will be explained below with reference to FIG. 4). The remaining word/probability records contained in module (108) also include a set of B flags, generated by a B Flags module (114), which indicate the length of such records. The address module (110) also partitions addresses into segments so as to reduce the number of bytes needed to write such addresses. The address module (110) stores this partition information which is then retrieved so as to determine the actual address value. The probability records contained in module (108) can be represented as ratio of count records (e.g., count3 and count12) which are generated and stored in counter module (122). Some of the count records (e.g., count12) can be used by a lambda weights module (124) to generate lambda weights that are used to calculate a sum of scores for 1-gram, 2-gram, 3-grams, etc. The word records contained in the word/ probability module (108) are sorted into descending frequency values (i.e., frequency in a given vocabulary) by a sorter module (126). A mapper/differentiator module (127) maps words in a vocabulary into integers (i.e., word numbers) and calculates the difference between subsequent word numbers which are stored as the word records in the word/probability module (108). Count records in the counter module (122) are sorted and stored using an index to their descending order log values via a probability index module (128), which generates and stores the index to the probabilities of the bigrams and trigrams records (in FIG. 4). Data is searched using either a binary search performed by a binary search module (118) on common history data in the common history module (102) and in the index module (106) or a sequential search by a sequential search module (120) on word/probability data contained in module (108).

Figure 2:
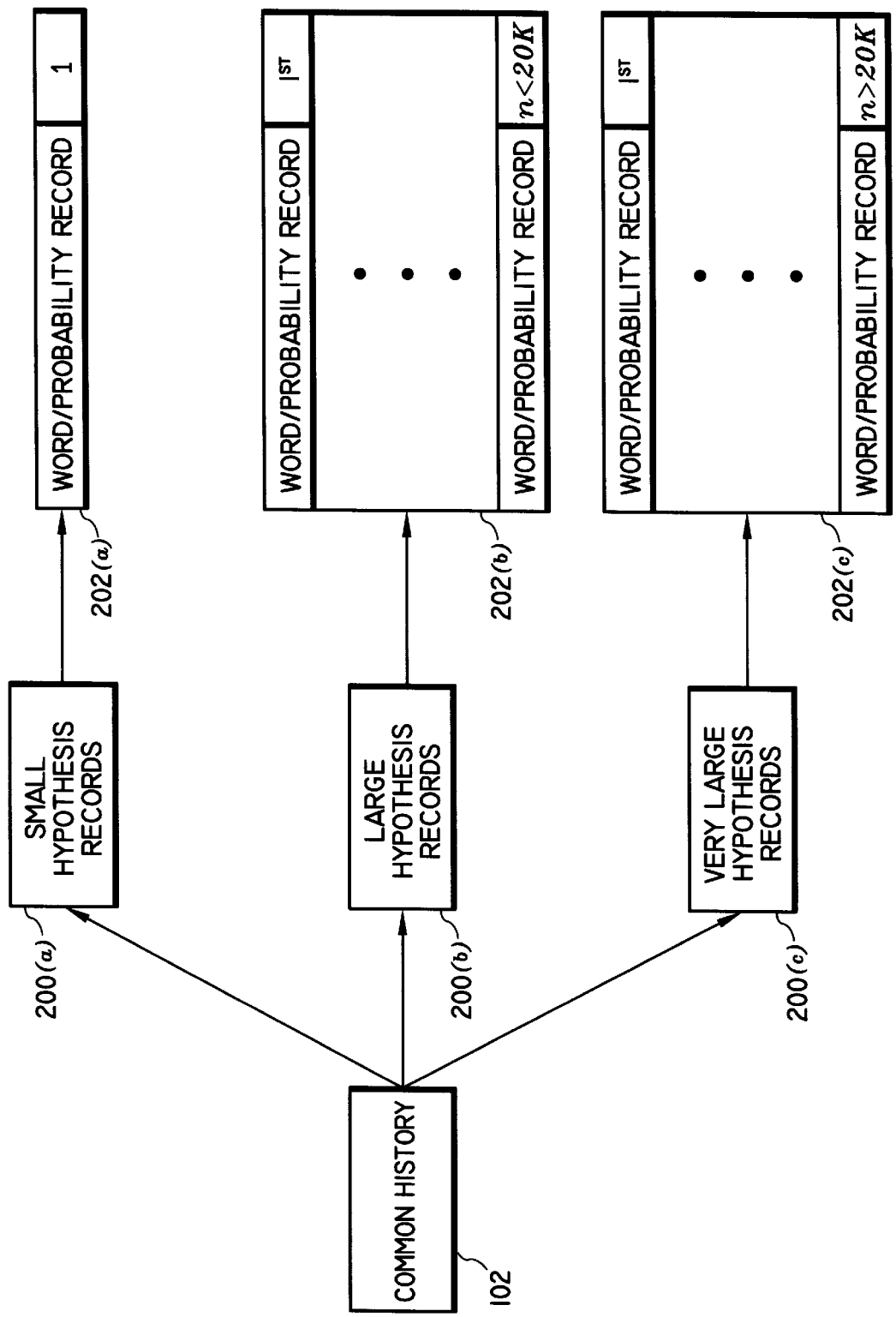
FIG. 2 is diagram illustrating a method for partitioning common history/hypothesis data of n-gram language models in accordance with the present invention.

The common history module (102) is operatively connected to a history partition module (116), wherein the common histories generated by module (102) are split into several parts. Referring now to FIG. 2, the several parts by which common histories 102 may be split into are as follows: a set of small hypothesis records (200a) which point to one word/probability record (202a); a set of large hypothesis records (200*b*) which point to less than n records (202*b*) (e.g., n<20,000); and a set of very large hypothesis records (200*c*) which point to more than n records (202*c*).

Referring now to FIG. 4, a general structure of the modified (i.e., compressed) language model in accordance with the present invention is shown. The storage requirements for the unigram probabilities remain as set forth in FIG. 3*a*. FIG. 4, however, illustrates the difference in the W2 table structure as compared to FIG. 3*b*.

First, the working vocabulary should be sorted by descending frequency. Since a linear search of the index part is performed to find W1, the average lookup time may be reduced by sorting in this manner.

Next, trigram-key entries are classified as two types: those with a single W3, and those with more than one W3. For the former classification, W3 is written in the key as shown in FIG. 4 (i.e, in place of the offset shown in FIG. 3*b*). By comparing FIGS. 3*b* and 4, it possible to see how history partitions provide additional data compression. In FIG. 4 (as in FIG. 3*b*), a common history (W1) is also written in an index area and also points to blocks of subsequent records W3. However, there are no history partitions in FIG. 3*b* (i.e. histories W1 are not partitioned in accordance with some rules). Namely, if there is only one record W3 for a given W1=j, it is written at the left of W1 (e.g., W3 W1 C12). Otherwise, an offset is written at the left of W1 to indicate where blocks of W3 records are stored. In accordance with the history partition method of the present invention, a different representation rule is used in the index block of FIG. 4 (as opposed to the index block of FIG. 3*b*). In FIG. 4 histories (W1) are split in two groups—the first group consists of those W1=j that have only one subsequent record W3=k (in a 3 tuple W1 W2 W3). The second group consists of remaining histories of W1=j that point to subsequent blocks of records W3 with more than one element.

In addition, as shown in FIG. 4, the length the first group and the second group comprising the index block for the given W2 table may be computed by the values (i.e., number of W1s) stored in locations NUM W1s1 and NUM W1s2, respectively, in the first line of the indes block.

Furthermore, only 2 bytes are used to store the offset in the trigram-key entries in FIG. 4. Consequently, W2s having exceptionally long trigram lists are handled separately. Specifically, W2s have exceptionally long trigram lists have some offset values that do not fit 2 bytes and therefore require 4 bytes. Such W2s are handled in accordance with the cumulative address procedure discussed in detail above.

As demonstrated above, a value of W3 is written into an index line instead of writing an address (offset) of subsequent block of records the first partition group. This reduces the storage of data related to the first group in the partition in FIG. 4 by 6 bytes for each line in the Index block. Specifically, only 2 bytes are used to represent W3 in the Index block instead of the 4 bytes needed for the offset in FIG. 3*b*. Moreover, there is no data written in the subsequent record blocks in Trigrams part of FIG. 4 (i.e. values related to W3 and prob are not written) which saves another 4 bytes.

Next, instead of storing W3 in the Bigrams and Trigrams blocks, differences of subsequent W3s are stored in 1 byte blocks, if such memory allocation sufficient, otherwise such differences are stored in 2 byte blocks. This is done for done for bigrams as well as trigrams. By way of example, assume the word index (i.e., W3) of the word "of" is 15,205 and the word index (W3) of the word "on" is 15,287. Rather than storing W3=15,287 in the record corresponding to the word "on", a smaller value delta_w3=15287−15205=82 can be stored instead, which can be stored in a 1 byte block. The saving in space that results is a consequence of the fact that the difference between the word indexes (W3s) is less than the word index of either word. The actual values of each W3 can be easily computed during a lookup operation by cumulatively adding the stored differences of the W3s.

Next, the probability entries are replaced by an index to probability/count (denoted by Ind Prob in FIG. 4) which are stored in 1 or 2 byte blocks as necessary. The probability/count array is stored separately. As discussed above, indexes to the values of log10(count3) are stored with flags in 1 byte or 2 byte blocks as needed. Since there is small number of different indexes for log10(count3), there are a large number of indexes that fit 1 byte. This results in a significant decrease in storage as compared to FIG. 3*b* where each probability is stored in 2 bytes. In FIG. 4, bit vectors are used to indicate whether such probabilities are stored as 1 byte or 2 bytes. In FIG. 3*b*, flags are not used. Advantageously, flags are used in FIG. 4 (LenVec2 and LenVec3) and as first bits in W3 and Probability records in the Bigrams and Trigrams Blocks. The LenVec2 and LenVec3 flags shown in FIG. 4 are used to indicate what the lengths of the first 16 records in the Bigrams block, as well as the first 8 records for each trigram table corresponding to a W1 in the Trigrams block. The top records in the Bigrams and Trigrams blocks are visited most often during a decoding. Since flags are written separately from records, the content of the records can be read faster.

In particular, referring to FIG. 4, LenVec2 and LenVec3 are bit vectors which store the information indicating whether a specific entry in the Bigram and Trigrams block uses 1 byte or 2 bytes. The first half of these two vectors correspond to word indices W3, and the second half of such vectors correspond to indices to probabilities. Similar to the method of storing an index value instead of an actual word "on" (i.e., an index value of 15,205 is stored if the word "on" is the 15,205th word in the vocabulary), the range of probabilities can be stored and retrieved by using an index. For example, if a probability of 0.5 is the 1500-th entry in this sorted list, the value 1500 is stored as opposed to the value 0.5 in the probability field. The sorted list of probabilities is stored separately.

Specifically, LenVec2 is 4 bytes (32 bits) long while each of the LenVec3's are 2 bytes (16 bits) each. The first 16 bits of LenVec2 indicates the size of delta_W3 for the first 16 bigrams (if there are fewer than 16 bigrams, those bits are not used); a 0 bit indicates 1 byte length while a bit 1 indicates 2 bytes. Likewise, the remaining 16 bits of LenVec2 indicate the size of the stored probability indices. If there are more than 16 bigrams, the size of such additional information is indicated in the first bit of the delta_W3 or probability index field directly in the Bigrams block.

Similarly, each LenVec3 (one for each W1 having more than one history record) in FIG. 4 stores information for the first 8 trigrams in the trigram table corresponding to that w1 (i.e, the first 8 bits of LenVec3 indicate the length of delta_W3 and the remaining 8 bits indicate the length of probability indices). Again, if there are more than 8 trigrams in a particular trigrams table, the length information is directly stored in the first bits of the delta_W3 and probability index records.

For the example model described above in FIG. 4, the compressed structure results in the trigrams utilizing approximately 30 MB of storage, approximately 22 MB of storage for the bigrams records, and 17.4 MB of storage for the trigram-keys, thereby resulting in a total memory allocation of 70 MB for the entire model (as compared to 124 MB previously in FIGS. 3*a* and 3*b*). The compressed language model of FIG. 4 provides an example of data compression with increased algorithmic complexity but decreased overall time of processing which was tested on PENTIUM class of computers. To test the time performance, the present inventors performed experiments on 10 speakers. The overall running time for processing a compressed n-gram language model was found to decrease by 25% on machines having PENTIUM central processing units. Further, the experiments demonstrated that the presently claimed compression methods are robust in that such methods can be applied to language models trained from large and small (filtered) data.

Although the illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for losslessly compressing an n-gram language model for storage in a storage device, the n-gram language model comprising a plurality of n-gram records generated from a training vocabulary, each n-gram record comprising an n-gram in the form of a series of "n-tuple" words (w1, w2, ... wn), a count and a probability associated therewith, each n-gram having a history represented by the initial n-1 words of the n-gram, said method comprising the steps of:

splitting said plurality of n-gram records into (i) a set of common history records comprising subsets of n-tuple words having a common history and (ii) sets of hypothesis records that are associated with the common history records, each set of hypothesis records including at least one hypothesis record comprising a word record-probability record pair;

partitioning said common history records into at least a first group and a second group, said first group comprising each common history record having a single hypothesis record associated therewith, said second group comprising each common history record having more than one hypothesis record associated therewith;

storing said hypothesis records associated with said second group of common history records in said storage device; and storing, in an index portion of said storage device, (i) each common history record of said second group together with an address that points to a location in said storage device having corresponding hypothesis records and (ii) each common history record of said first group together with its corresponding single hypothesis record.

2. The method of claim 1, wherein n=3, wherein the step of splitting comprises the step of generating common history records and hypothesis records for each w2 word of the plurality of n-grams, and wherein the hypothesis records comprise (i) bigram records having a common history w2 and (ii) trigram records having a common history w1 w2, the method further comprising the step of generating an index block for each w2 word, the index block comprising a plurality of entries, each entry (i) corresponding to a different w1 word having a common history with the w2 word and (ii) having an address that points to a block of trigram records having different w3 words but a common history w1 and w2.

3. The method of claim 1, further comprising the steps of:

mapping words of said n-gram records into word numbers based on a frequency of occurrence of said words in said training vocabulary;

sorting the word-probability records in each of said sets of hypothesis records based on the word numbers corresponding to the word records;

calculating a difference between subsequent ones of the sorted word numbers of said word records; and storing said differences to represent said word records.

4. The method of claim 3, wherein the step of mapping comprises the steps of (i) assigning an integer value to each unique word in the training vocabulary comprising N words from 1 to N such that a most frequently occurring word in the training vocabulary is assigned a integer value of 1 and the least frequently occurring word in the training vocabulary is assigned value N, and (ii) sorting said word numbers in descending frequency from integer value 1 to integer value N, wherein said word-probability records for each subset of hypothesis records are sorted in an increasing order of the integer values of the word numbers corresponding to said word records.

5. The method of claim 1, further comprising the steps of:

partitioning said addresses in said index portion into i segments;

mapping each address in each of the i segments to an index number; and storing said index numbers in said index portion to represent said addresses.

6. The method of claim 5, wherein each of the i segments comprise no more than 65,536 addresses, and wherein the index numbers of the i-th segment are equal to A-(i1) * 65,536 where A represents the actual address in the i-th segment.

7. The method of claim 6, further comprising the steps of storing a table of multiples comprising values that are used for determining the actual address value of an index number of an i-th segment, wherein the actual address value of the index number of the i-th segment is determined by adding a value equal to i*65,536 to said index number.

8. The method of claim 1, further comprising the steps of:

computing a count value for each count associated with the n-gram records, said count value being equal to log10(count);

sorting each unique count value in descending order and generating an index to the sorted count values; and storing an index to said count values in said hypothesis records to represent said probability records.

9. The method of claim 8, further comprising the step of determining a series of lambda weights for said probability records on the run from said stored count values.

10. The method of claim 8, further comprising the steps of computing a probability value on the run for a given hypothesis record by accessing the count values associated with said stored index and computing the difference between the log10 count values for the corresponding probability record.

11. The method of claim 1, further comprising the steps of:

splitting each of said sets of hypothesis records into a first set and a second set, said first set containing the first n records of the set of hypothesis records and said second set containing the remainder of the set of hypothesis records;

storing an A flag in the index portion of said storage device for each of said first sets of n records to mark a byte length for each of said n records; and storing a B flag in the word records and probability records of each second set of remaining hypothesis records to mark a byte length for each of said remaining records.

12. The method of claim 11, wherein said B flags are stored such that the length of said B flags plus said word records and probability records occupy a multiple of bytes.

13. The method of claim 1, wherein each set of hypothesis records corresponds to at least one of the subsets of n-tuple words having a common history, and wherein each common history record is stored together with its corresponding sets of hypothesis records and a unique index block having the addresses that point to locations of the corresponding hypothesis records, in a contiguous block of memory locations of the storage device.

14. The method of claim 1, further comprising the step of storing at the beginning of the index portion of said storage device, a first parameter and a second parameter for determining, respectively, (i) a block size of said index portion comprising said first group of common history records and said addresses and (ii) a block size of said index portion comprising said second group of common history records and corresponding hypothesis records.

15. The method of claim 1, wherein at least one of the pairs of word-probability records have the word record and probability record stored in fractions of bytes such that the at least one hypothesis record is stored as a multiple of a byte.

16. The method of claim 15, further comprising the step of storing a flag for the at least one hypothesis record to indicate its byte length.

17. A program storage device readable by a machine, tangibly embodying a program of instructions executable by the machine to perform method steps for losslessly compressing an n-gram language model for storage in a storage device, the n-gram language model comprising a plurality of n-gram records generated from a training vocabulary, each n-gram record comprising an n-gram in the form of a series of "n-tuple" words (w1, w2, . . . wn), a count and a probability associated therewith, each n-gram having a history represented by the initial n-1 words of the n-gram, said method comprising the steps of:

splitting said plurality of n-gram records into (i) a set of common history records comprising subsets of n-tuple words having a common history and (ii) sets of hypothesis records that are associated with the common history records, each set of hypothesis records including at least one hypothesis record comprising a word record-probability record pair;

partitioning said common history records into at least a first group and a second group, said first group comprising each common history record having a single hypothesis record associated therewith, said second group comprising each common history record having more than one hypothesis record associated therewith;

storing said hypothesis records associated with said second group of common history records in said storage device; and storing, in an index portion of said storage device, (i) each common history record of said second group together with an address that points to a location in said storage device having corresponding hypothesis records and (ii) each common history record of said first group together with its corresponding single hypothesis record.

18. The program storage device of claim 17, wherein n=3, wherein the instructions for performing the step of splitting comprise instructions for performing the step of generating common history records and hypothesis records for each w2 word of the plurality of n-grams, and wherein the hypothesis records comprise (i) bigram records having a common history w2 and (ii) trigram records having a common history w1 w2, the program storage device further comprising instructions for performing the step of generating an index block for each w2 word, the index block comprising a plurality of entries, each entry (i) corresponding to a different w1 word having a common history with the w2 word and (ii) having an address that points to a block of trigram records having different w3 words but a common history w1 and w2.

19. The program storage device of 17 further comprising instructions for performing the steps of:

mapping words of said n-gram records into word numbers based on a frequency of occurrence of said words in said training vocabulary;

sorting the word-probability records in each of said sets of hypothesis records based on the word numbers corresponding to the word records;

calculating a difference between subsequent ones of the sorted word numbers of said word records; and storing said differences to represent said word records.

20. The program storage device of claim 19, wherein the instructions for performing the step of mapping comprise instructions for performing the steps of (i) assigning an integer value to each unique word in the training vocabulary comprising N words from 1 to N such that a most frequently occurring word in the training vocabulary is assigned a integer value of 1 and the least frequently occurring word in the training vocabulary is assigned value N, and (ii) sorting said word numbers in descending frequency from integer value 1 to integer value N, wherein said word-probability records for each subset of hypothesis records are sorted in an increasing order of the integer values of the word numbers corresponding to said word records.

21. The program storage device of claim 17, further comprising instructions for performing the steps of:

partitioning said addresses in said index portion into i segments;

mapping each address in each of the i segments to an index number; and storing said index numbers in said index portion to represent said addresses.

22. The program storage device of claim 21, wherein each of the i segments comprise no more than 65,536 addresses, and wherein the index numbers of the i-th segment are equal to A-(i-1) * 65,536 where A represents the actual address in the i-th segment.

23. The program storage device of claim 22, further comprising instructions for performing the step of storing a table of multiples comprising values that are used for determining an actual address value of an index number of an i-th segment, wherein the actual address value of the index number of the i-th segment is determined by adding a value equal to i*65,536 to said index number.

24. The program storage device claim 17, further comprising instructions for performing the steps of:

computing a count value for each count associated with the n-gram records, said count value being equal to log10(count);

sorting each unique count value in descending order and generating an index to the sorted count values; and storing an index to said count values in said hypothesis records to represent said probability records.

25. The program storage device of claim 24, further comprising instructions for performing the steps of computing a probability value on the run for a given hypothesis record by accessing the count values associated with said stored index and computing the difference between the log10 count values for the corresponding probability record.

26. The program storage device of claim 24, further comprising instructions for performing the step of determining a series of lambda weights for said probability records on the run from said stored count values.

27. The program storage device of claim 17, further comprising instructions for performing the steps of:

splitting each of said sets of hypothesis records into a first set and a second set, said first set containing the first n records of the set of hypothesis records and said second set containing the remainder of the set of hypothesis records;

storing an A flag in the index portion of said storage device for each of said first sets of n records to mark a byte length for each of said n records; and storing a B flag in the word records and probability records of each second set of remaining hypothesis records to mark a byte length for each of said remaining records.

28. The program storage device of claim 27, wherein said B flags are stored such that the length of said B flags plus said word records and probability records occupy a multiple of bytes.

29. The program storage device of claim 17, wherein each set of hypothesis records corresponds to at least one of the subsets of n-tuple words having a common history, and wherein each common history record is stored together with its corresponding sets of hypothesis records and a unique index block having the addresses that point to locations of the corresponding hypothesis record, in a contiguous block of memory locations of the storage device.

30. The program storage device of claim 17, further comprising instructions for performing the step of storing at the beginning of the index portion of said storage device, a first parameter and a second parameter for determining, respectively, (i) a block size of said index portion comprising said first group of common history records and said addresses and (ii) a block size of said index portion comprising said second group of common history records and corresponding hypothesis records.

31. The program storage device of claim 17, wherein at least one of the pairs of word- probability records have the word record and probability record stored in fractions of bytes such that the at least one hypothesis record is stored as a multiple of a byte.

32. The program storage device of claim 31, further comprising instructions for performing the step of storing a flag for the at least one hypothesis record to indicate its byte length.

* * * * *